United States Patent
Lee et al.

(10) Patent No.: US 9,780,297 B2
(45) Date of Patent: Oct. 3, 2017

(54) ELECTRONIC DEVICE HAVING A VARIABLE RESISTANCE ELEMENT WITH A PROTECTION LAYER AND METHOD FOR FABRICATING THE SAME

(71) Applicant: SK hynix Inc., Icheon-Si (KR)

(72) Inventors: Bo-Mi Lee, Icheon-Si (KR); Cha-Deok Dong, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 14/444,969

(22) Filed: Jul. 28, 2014

(65) Prior Publication Data
US 2015/0092481 A1 Apr. 2, 2015

(30) Foreign Application Priority Data
Sep. 30, 2013 (KR) ........................ 10-2013-0116113

(51) Int. Cl.
| | |
|---|---|
| *G11C 11/00* | (2006.01) |
| *H01L 43/02* | (2006.01) |
| *G11C 11/16* | (2006.01) |
| *G11C 11/15* | (2006.01) |
| *G11C 11/155* | (2006.01) |
| *H01L 21/28* | (2006.01) |
| *H01L 43/08* | (2006.01) |
| *H01L 43/12* | (2006.01) |

(52) U.S. Cl.
CPC .............. *H01L 43/02* (2013.01); *G11C 11/15* (2013.01); *G11C 11/155* (2013.01); *G11C 11/161* (2013.01); *H01L 21/28141* (2013.01); *H01L 43/08* (2013.01); *H01L 43/12* (2013.01); *G11C 11/1675* (2013.01); *G11C 2211/5615* (2013.01)

(58) Field of Classification Search
CPC . H01L 21/28141; G11C 11/155; G11C 11/15; G11C 2211/5615
See application file for complete search history.

(56) References Cited

U.S. PATENT DOCUMENTS

| | | | |
|---|---|---|---|
| 8,288,023 B2 | 10/2012 | Gao et al. | |
| 8,994,131 B2* | 3/2015 | Shimomura | .......... G11C 11/161 257/421 |
| 9,411,734 B2* | 8/2016 | Dong | .................. G06F 12/0842 |
| 2005/0207071 A1* | 9/2005 | Sato | ...................... B82Y 10/00 360/324.2 |
| 2011/0233697 A1* | 9/2011 | Kajiyama | ............... G11C 11/16 257/421 |
| 2012/0061783 A1 | 3/2012 | Anderson et al. | |
| 2013/0103884 A1* | 4/2013 | Cho | ..................... G11C 29/765 711/102 |

FOREIGN PATENT DOCUMENTS

KR 10-2012-0115202 A 10/2012

* cited by examiner

*Primary Examiner* — Kretelia Graham
(74) *Attorney, Agent, or Firm* — Perkins Coie LLP

(57) ABSTRACT

An electronic device includes a semiconductor memory, wherein the semiconductor memory includes: a variable resistance element having a stacked structure of a first magnetic layer, a tunnel barrier layer, and a second magnetic layer; and a protection layer including a pillar-shaped magnetic compensation layer and a non-magnetic layer, which are formed on the sidewall of the variable resistance element.

26 Claims, 11 Drawing Sheets

ELECTRONIC DEVICE HAVING A VARIABLE RESISTANCE ELEMENT WITH A PROTECTION LAYER AND METHOD FOR FABRICATING THE SAME

CROSS-REFERENCE TO RELATED APPLICATIONS

The present application claims priority of Korean Patent Application No. 10-2013-0116113, entitled "ELECTRONIC DEVICE AND METHOD FOR FABRICATING THE SAME" and filed on Sep. 30, 2013, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic appliances such as a computer, a portable communication device, and so on, and research and development for such semiconductor devices have been conducted. Examples of such semiconductor devices include semiconductor devices which can store data using a characteristic that they are switched between different resistance states according to an applied voltage or current, and can be implemented in various configurations including, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes a semiconductor device and a method for fabricating the same, which secures an etch margin for a patterning process by reducing the total thickness of a variable resistance element when a variable resistance element is formed, and forms a magnetic compensation layer in a spacer shape using a material having horizontal magnetization such that vertical magnetic fields uniformly enter magnetic layers, thereby improving the magnetic characteristic and lowering the difficulty level of the process.

In one aspect, an electronic device is provided to include a semiconductor memory unit that includes: a variable resistance element having a stacked structure of a first magnetic layer, a tunnel barrier layer, and a second magnetic layer; and a protection layer including a pillar-shaped magnetic compensation layer and a non-magnetic layer, which are formed on both sidewalls of the variable resistance element. In another aspect, an electronic device is provided to include a semiconductor memory unit that includes: a variable resistance element having a stacked structure that includes a first magnetic layer, a tunnel barrier layer, and a second magnetic layer, wherein the tunnel barrier layer is between the first magnetic layer and the second magnetic layer, and wherein the variable resistance element includes a sidewall; and a protection layer formed on the sidewall of the variable resistance element, wherein the protection layer includes both a magnetic compensation layer formed on the sidewall and a non-magnetic layer formed on the sidewall. In another aspect, an electronic device is provided to include a semiconductor memory unit that includes: a variable resistance element having a stacked structure that includes a first magnetic layer, a tunnel barrier layer, and a second magnetic layer, wherein the tunnel barrier layer is between the first magnetic layer and the second magnetic layer; and a protection layer formed on the sidewall of the variable resistance element, wherein the protection layer includes both a magnetic compensation layer formed on the sidewall and a non-magnetic layer formed on the sidewall.

Implementations of the above aspects may include one or more the following.

In some implementations, the magnetic compensation layer comprises a conductive material having a horizontal magnetization. In some implementations, the magnetic compensation layer comprises a magnetic material having a horizontal magnetization substantially parallel to a layer in the variable resistance element. In some implementations, the magnetic compensation layer comprises one or more of Co, Fe, Ni, Nd and a mixture thereof. In some implementations, the first magnetic layer comprises a pinned ferromagnetic layer and the second magnetic layer comprises a free ferromagnetic layer, or the first magnetic layer comprises a free ferromagnetic layer and the second magnetic layer comprises a pinned ferromagnetic layer. In some implementations, each of the first magnetic layer and the second magnetic layer comprises a magnetic layer or a multilayer structure of two or more magnetic layers, wherein the first or second magnetic layer includes a material selected from the group consisting of CoFe, CoFeB, CoFeBTa, and CoFeBSi. In some implementations, the tunnel barrier layer comprises a material selected from the group consisting of MgO, $Al_2O_3$, $TiO_2$, $HfO_2$, and $Ta_2O_3$. In some implementations, wherein the variable resistance element may further include an anti-oxidation layer formed between the variable resistance element and the protection layer. In some implementations, the variable resistance element comprises a bottom electrode disposed at the bottom of the variable resistance element. In some implementations, the variable resistance element comprises a top electrode disposed at the top of the variable resistance element. In some implementations, the bottom electrode or the top electrode comprises any one metal layer or a combination of two or more metal layers selected from a group consisting of Ta, Ru, PtMn, Cr, W, Ti, TiN, TaN, AlTiN, HfN, and HfB.

In some implementations, the semiconductor memory unit may include: a conductive line disposed between the magnetic correction layer and the second electrical contact layer and electrically coupled to the variable resistance element, wherein the magnetic correction layer is separated from and is electrically insulated from the conductive line. In some implementations, the magnetization directions of the pinned magnetic layer, the magnetic correction layer and the free magnetic layer may be perpendicular to surfaces of the pinned magnetic layer, the magnetic correction layer and the free magnetic layer. In some implementations, the magnetic correction layer may have a width in a direction parallel to its surface which is smaller than a width in a direction perpendicular to its surface. In some implementations, the magnetic correction layer may have a pattern that spatially overlaps with the variable resistance element. In some implementations, the semiconductor memory unit may include: one or more additional variable resistance elements identically constructed as the variable resistance element and arranged to form a 2-dimensional array with the variable resistance element, and wherein the magnetic correction layer overlaps with at least two variable resistance elements of the 2-dimensional array. In some implementations, the magnetic correction layer may include a first ferromagnetic substance layer, a noble metal layer and a second ferromagnetic substance layer which are sequentially stacked. In some implementations, the semiconductor memory unit may include a dielectric layer interposed between the variable resistance element and the magnetic correction layer. In some implementations, the semiconductor memory unit may include a dielectric layer interposed between the conductive line and the magnetic correction layer.

In some implementations, the magnetic compensation layer is configured with a magnetization direction opposite to the magnetization direction of the pinned ferromagnetic layer to compensate for the effect of the pinned ferromagnetic on the free ferromagnetic layer. In some implementations, the protection layer on the sidewall serves as an etch barrier for the first magnetic layer and the second magnetic layer during an etch process to prevent the first and second magnetic layers from losing magnetization. In some implementations, the protection layer is absent from the top surface of the variable resistance stack. In some implementations, the protection layer is absent in a gap between two adjacent variable resistance elements. In some implementations, each section of the magnetic compensation layer has a pillar shape which enhances the horizontal magnetization through a shape magnetic anisotropy effect.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the variable resistance element is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

In another aspect, a method is provided for fabricating an electronic device having a semiconductor memory unit. This method includes: forming a variable resistance element over a substrate, the variable resistance element having a stacked structure of a first magnetic layer, a tunnel barrier layer, and a second magnetic layer; and forming a protection layer on both sidewalls of the variable resistance element, the protection layer comprising a pillar-shaped magnetic compensation layer and a non-magnetic layer. In another aspect, a method for fabricating an electronic device comprising a semiconductor memory unit that includes a variable resistance element is provided. The method includes forming a first magnetic layer, a tunnel barrier layer, and a second magnetic layer as part of a stacked structure over a substrate, wherein the tunnel barrier layer is between the first magnetic layer and the second magnetic layer; and forming a protection layer on sidewalls of the variable resistance element to include a magnetic compensation layer and a non-magnetic layer.

Implementations of the above aspects may include one or more of the following.

In some implementations, the forming of the variable resistance element may include forming a first magnetic layer over the substrate; forming a tunnel barrier layer over the first magnetic layer; forming a second magnetic layer over the tunnel barrier layer; and forming the variable resistance element by patterning the second magnetic layer, the tunnel barrier layer, and the first magnetic layer. In some implementations, the forming of the protection layer may include forming a metallic magnetic layer along the entire structure including the variable resistance element; etching the metallic magnetic layer to be left on the sidewalls of the variable resistance element; and changing the metallic magnetic layer into a non-magnetic layer by performing tilt ion implant on the metallic magnetic layer. In some implementations, the forming of the protection layer may include forming a metallic magnetic layer over the variable resistance element to cover top and side surfaces of a structure including the variable resistance element; etching the metallic magnetic layer to substantially remove the metallic magnetic layer from the top surface while keeping the metallic magnetic layer left on sidewalls of the variable resistance element; and changing portions of the metallic magnetic layer into a non-magnetic layer by performing a tilt ion implant on the portions of the metallic magnetic layer. In some implementations, the tilt ion implant may be performed by implanting impurities including As or Ph. In some implementations, the metallic magnetic layer may include a material having horizontal magnetization. In some implementations, the metallic magnetic layer comprises a magnetic material having a horizontal magnetization substantially parallel to the metallic magnetic layer. In some implementations, the metallic magnetic layer may include a ferromagnetic material or anti-ferromagnetic material. In some implementations, the metallic magnetic layer may include one or more of Co, Fe, Ni, Nd, and a mixture thereof. In some implementations, the method may further include forming a bottom electrode layer over the substrate, prior to the forming of the first magnetic layer. In some implementations, the method may further include forming a top electrode layer over the second magnetic layer, after the forming of the second magnetic layer. In some implementations, the method may further include forming an anti-oxidation layer on the sidewalls of the variable resistance element, prior to the forming of the protection layer. In some implementations, the magnetic compensation layer has a pillar shape which enhances the horizontal magnetization.

These and other aspects, implementations and associated advantages are described in greater detail in the drawings, the description and the claims.

DETAILED DESCRIPTION

Figure 1:
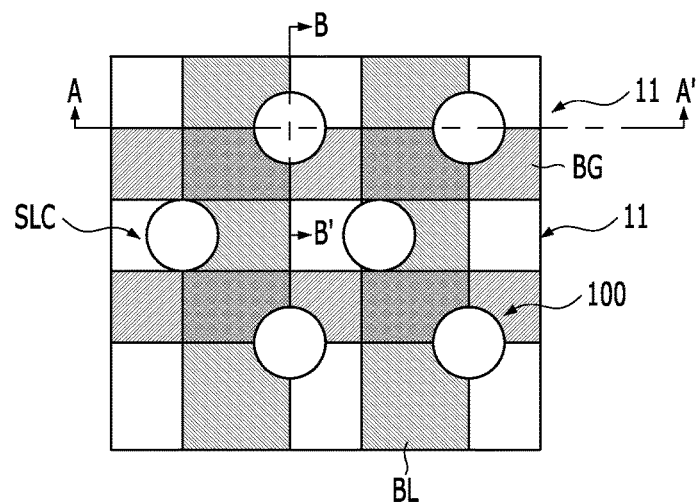
FIG. 1 shows a plan view of a semiconductor device in accordance with an implementation of this patent disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

A magnetic tunnel junction (MTJ) element is an example of a variable resistance element for storing digital data based on switching between different resistance states in response to an applied voltage or current. The magnetic tunnel junction in an MTJ element includes a free magnetic layer with a changeable magnetization direction, a tunnel barrier layer and a pinned magnetic layer with a pinned magnetization direction. As explained in greater detail below, the magnetic field of the pinned magnetic layer can produce a undesired influence to the free magnetic layer. To mitigate this undesired effect, a magnetic correction layer can be implemented near the layers of the MTJ element to produce and apply a correction magnetic field to offset the undesired influence of the pinned magnetic layer on the free magnetic layer.

The disclosed implementations provide a semiconductor device including a variable resistance element capable of reducing the total thickness of a stack so as to reduce an etching burden during a patterning process, and a method for fabricating the same. In some implementations, a vertical variable resistance element includes a magnetic compensation layer formed over a pinned layer to prevent the field of a magnetic layer in the variable resistance element from being shifted by a stray field of the pinned layer. However, the thickness of this magnetic compensation layer may cause sidewalls of the magnetic layers to lose magnetism due to etch damage during a patterning process. Furthermore, electrical shorting may occur due to re-deposition of etch products, and a process margin may be increased with the increase of an etching time. The disclosed technology can be used to provide designs of and fabrication technique for a semiconductor device including a variable resistance element capable of reducing the total thickness of device to allow for reducing an etching burden during a patterning process, while the magnetic compensation layer remains unaffected. FIG. 1 shows a plan view of a semiconductor device in accordance with an implementation of this patent disclosure.

Referring to FIG. 1, this semiconductor device includes an isolation layer 1A formed on a semiconductor substrate 11 to define a line-type active region 11B. In some embodiments, a switching element, for example, the buried gates "BG" shown in FIG. 1, may be formed in a direction crossing the active region 11B. Note that various other implementations of the line-type active region and the switching element are possible. The active region 11B may include an island-type active region, and the switching element may include, in addition to the buried gate type shown, various applicable gate types, such as a recessed gate, a flat gate, and a vertical gate.

Variable resistance elements 100, source line contacts SLC and the like may be formed over the active region 11B. The variable resistance elements 100 may be arranged in a matrix configuration. Furthermore, the variable resistance elements 100 and the source line contacts SLC may be repetitively arranged so as to spatially deviate from each other, and each of the source line contact SLC may be disposed between a pair of switching elements BG. Furthermore, the source line contact SLC may be disposed to have a predetermined interval between each SLC and an adjacent variable resistance element 100 in the plurality of the variable resistance elements 100.

Figure 2A:
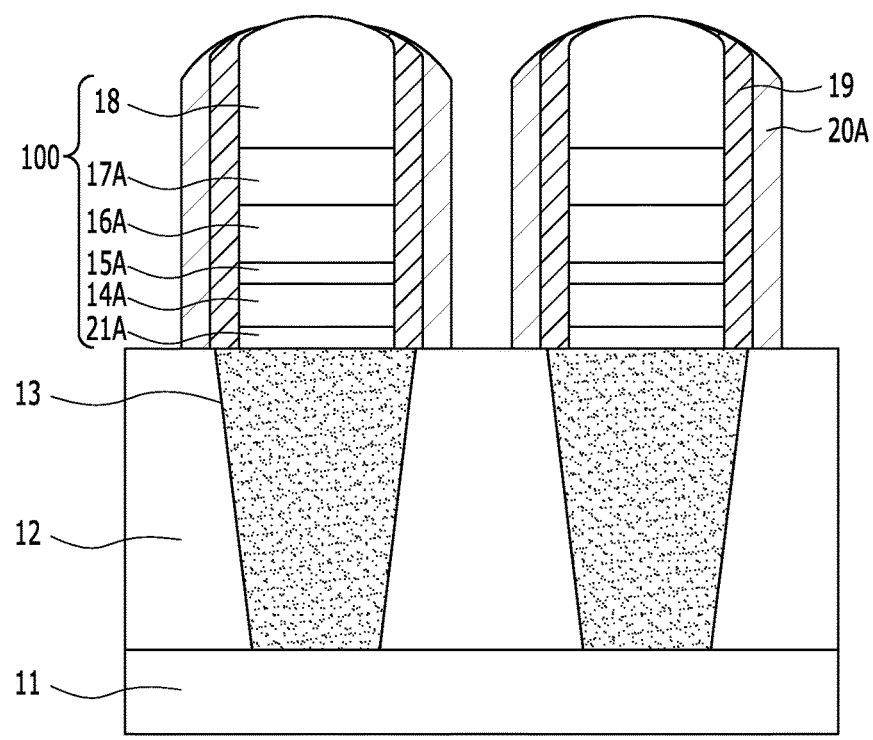
FIG. 2A shows a cross-sectional view of the semiconductor device in FIG. 1 taken along line A-A' in accordance with an implementation of this patent disclosure.
Figure 2B:
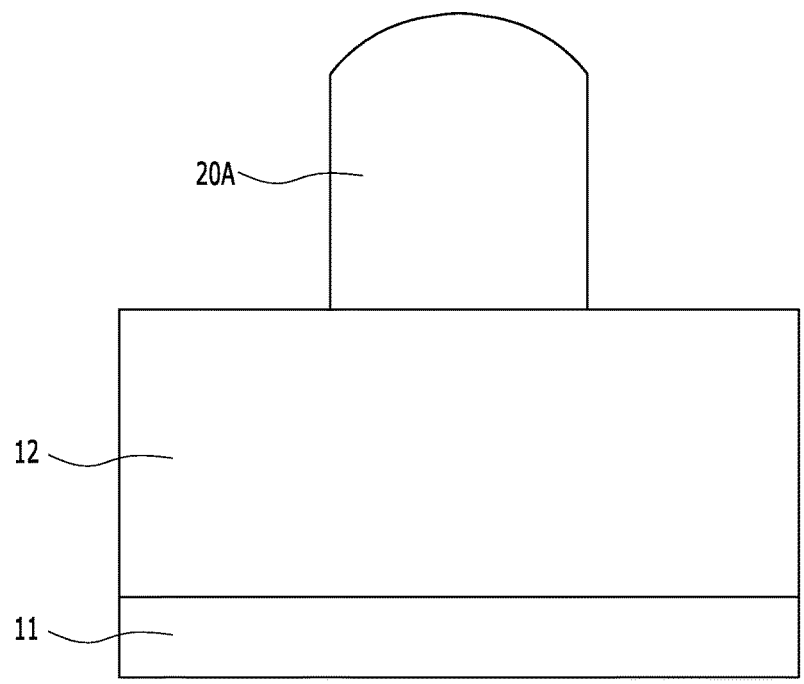
FIG. 2B shows a cross-sectional view of the semiconductor device in FIG. 1 taken along line B-B' in accordance with an implementation of this patent disclosure.
Figure 2C:
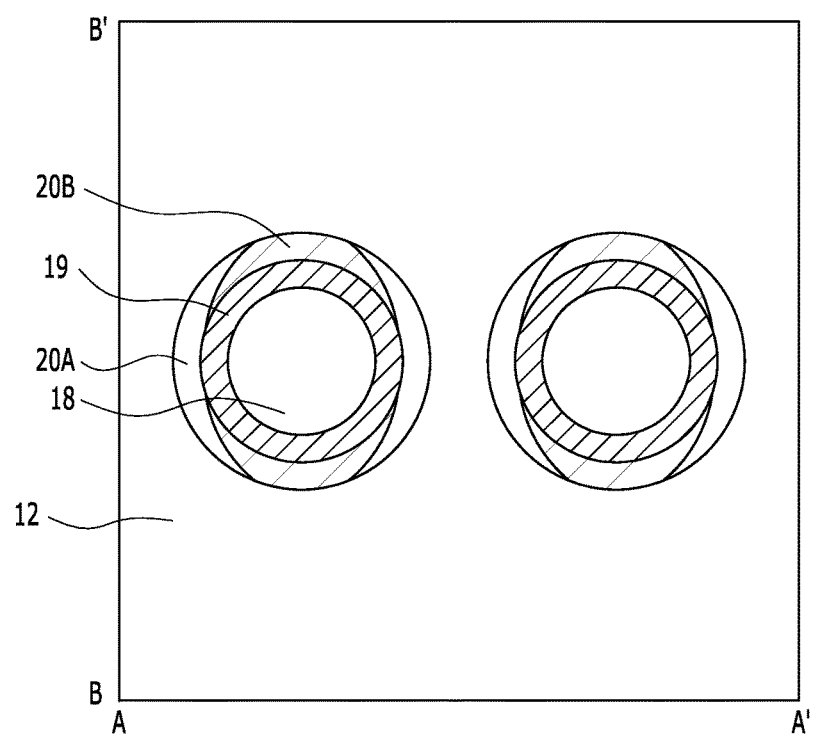
FIG. 2C shows a top view of the semiconductor device in FIG. 1 in accordance with an implementation of this patent disclosure.

FIG. 2A is a cross-sectional view of the semiconductor device in FIG. 1 taken along line A-A' in accordance with an implementation of this patent disclosure. FIG. 2B is a cross-sectional view of the semiconductor device in FIG. 1 taken along line B-B' in accordance with an implementation of this patent disclosure. FIG. 2C is a top view of the semiconductor device in FIG. 1 in accordance with an implementation of this patent disclosure, which includes the top views of the structures shown in FIGS. 2A and 2B.

Referring to FIGS. 2A to 2C, the semiconductor device in accordance with the implementation may include a substrate 11 having a switching element formed therein, an interlayer dielectric layer 12 formed over the substrate 11, and a contact plug 13 electrically coupling one end of the switching element to a variable resistance element 100 through the interlayer dielectric layer 12. The variable resistance element 100 as shown is formed or embedded in the interlayer dielectric layer 12 and may be formed over the interlayer dielectric layer 12 in other implementations.

The variable resistance element 100 may have a stacked structure of a first electrode 21A, a first magnetic layer 14A, a tunnel barrier layer 15A, a second magnetic layer 16A, a second electrode 17A, and a hard mask pattern 18. Hence, the variable resistance element 100 may be referred to as a "variable resistance stack." In particular, the variable resistance element 100 may further include an anti-oxidation layer 19 and a protection layer 20A (which is one part of the protection layer as shown in FIG. 2B and FIG. 2C) and 20B (which is the other part of the protection layer as shown in FIG. 2A and FIG. 2C) on the sidewall of the stacked structure. The stacked structure of the variable resistance element 100, the anti-oxidation layer 19, and the protection layer 20A will be collectively referred to as a "variable resistance element".

Notably, the variable resistance element 100 may have a different resistance value according to the magnetization directions of the two magnetic layers 14A and 16A. For example, when the magnetization directions of the two magnetic layers 14A and 16A are identical to each other (or substantially parallel to each other), the variable resistance element 100 may have a low resistance state, and when the magnetization directions of the two magnetic layers 14A and 16A are different from each other (e.g., anti-parallel to each other), the variable resistance element 100 may have a high resistance state.

In some embodiments, one of the first and second magnetic layers 14A and 16A may include a pinned ferromagnetic layer of which the magnetization direction is pinned to a fixed direction, and the other magnetic layer may include a free ferromagnetic layer of which the magnetization direction can be varied according to the direction of a current applied to the variable resistance element 100. Each of the first and second magnetic layers 14A and 16A may include a monolayer or single layer, or a multilayer structure containing a ferromagnetic material, for example, Fe—Pt alloy, Fe—Pd alloy, Co—Pd alloy, Co—Pt alloy, Co—Fe alloy, Fe—Ni—Pt alloy, Co—Fe—Pt alloy, Co—Ni—Pt alloy, Co—Fe—B alloy, Co—Fe—B—Ta alloy, Co—Fe—B—Si alloy, among others. This ferromagnetic material may further include impurities such as boron (B). Other implementations beyond the particular ferromagnetic materials described above are possible.

The magnetization direction of the free ferromagnetic layer may be changed through electron tunneling through the tunnel barrier layer 15A. The tunnel barrier layer 15A may include a monolayer or single layer, or a multilayer structure containing a dielectric material, for example, oxide, such as $Al_2O_3$, MgO, CaO, SrO, TiO, VO, NbO, $HfO_2$, $Ta_2O_3$ or others. Other dielectric material implementations are possible.

Each of the first and second electrodes 21A and 17A may include a metallic layer. The metallic layer is an electrically conductive layer containing a metal element, which may include metal, metal oxide, metal nitride, metal oxynitride, metal silicide and the like.

The first electrode 21A may serve as a bottom electrode of the variable resistance element 100, and the second electrode 17A may serve as a top electrode of the variable resistance element 100. Furthermore, the second electrode 17A may serve to protect lower layers of the variable resistance element 100 during fabrication processes and may serve as an etch barrier for patterning the lower layers.

The switching element for selecting a specific unit cell in a semiconductor device that includes a plurality of unit cells may be disposed within each of the unit cells, wherein the switching element may include a transistor, a diode and the like. One end of the switching element may be electrically coupled to the contact plug 13, and the other end of the switching element may be electrically coupled to a source line through a respective source line contact SLC.

The contact plug 13 may include a semiconductor layer or a metallic layer, and the variable resistance element 100 may have a larger critical dimension (CD) or area than that of the contact plug 13.

In the present implementation, the protection layer 20A is not stacked vertically in the variable resistance element 100, but formed in a spacer-like structure on the sidewall of the variable resistance element 100, thereby reducing the total thickness of the variable resistance element 100. Because the protection layer 20A is formed on the sidewall of the variable resistance element 100 rather than on the top, the total thickness of the variable resistance element 100 may be reduced by the thickness of the protection layer 20A comparing to some other designs wherein a protection layer is stacked on top of a variable resistance element. Thus, the disclosed design can reduce an etch burden during a patterning process that forms the device. Therefore, the damage to the sidewall from etching is reduced and the problem of re-deposition of etch products is mitigated during the patterning process. The magnetic characteristic of the variable resistance element 100 under the current design can may be improved. Furthermore, because the protection layer 20A is formed in a pillar shape, and may use a material having a horizontal magnetization (i.e., parallel to the substrate 11) instead of a material having a vertical magnetization (i.e., perpendicular to the substrate 11), the magnetic characteristic of the variable resistance element 100 may be improved, and the difficulty level of the process may be reduced.

Further referring to FIG. 2C, the protection layer 20A is a magnetic correction or compensation layer 20A and there is another non-magnetic layer 20B formed outside portions of the sidewalls of the protection layer 20A. The layers 20A and 20B thus form a composite layer as the protection layer of the variable resistance element 100 enclosed by the layers 20A and 20B.

The magnetic compensation layer 20A serves to reduce, mitigate or offset the influence of magnetic fields on the free ferromagnetic layer by the pinned ferromagnetic layer, thereby preventing magnetic field deflection of the free ferromagnetic layer. The magnetic compensation layer 20A is formed in a spacer-like structure on the sidewall of the variable resistance element 100, and may be formed to surround a portion of the sidewall of the variable resistance element 100. The magnetic compensation layer 20A may include a ferromagnetic material or anti-ferromagnetic material. In some embodiments, the magnetic compensation layer 20A may include a material having horizontal magnetization, for example, a ferromagnetic material such as Co, Fe, Ni, or Nb or a mixture thereof. Furthermore, as the magnetic compensation layer 20A is formed in a pillar shape on the sidewall of the variable resistance element 100, the vertical magnetic fields may uniformly enter the respective magnetic layers within the variable resistance element 100 regardless of the thicknesses or heights of the respective magnetic layers. Thus, uniform and strong stray fields may be formed to maximize the effect of preventing magnetic field deflection in the free ferromagnetic layer.

FIGS. 3A to 3G illustrate a process for fabricating the semiconductor device illustrated in FIGS. 2A-2C in accordance with an implementation of this patent disclosure. More specifically, FIGS. 3A to 3G show cross-sectional views taken along line A-A' of FIG. 1. For the convenience of explanation, like reference numerals will be used in FIGS. 1 to 3.

Figure 3A:
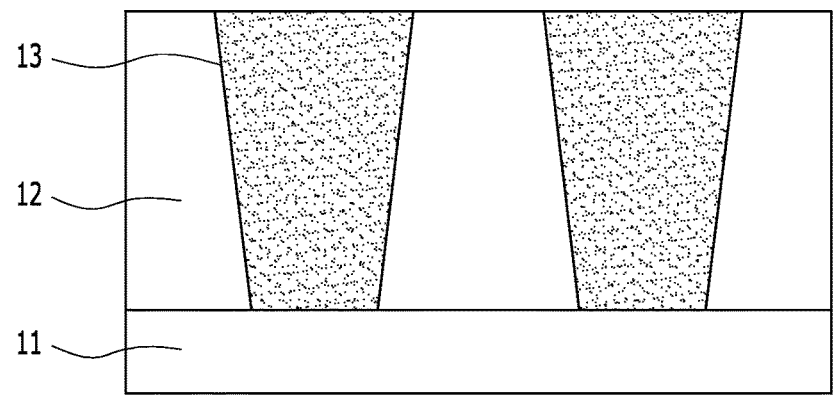
FIGS. 3A to 3G illustrate a process for fabricating the semiconductor device illustrated in FIGS. 2A-2C in accordance with an implementation of this patent disclosure.

Referring to FIG. 3A, a substrate 11 including a prefabricated structure, for example, a switching element (not illustrated) and the like is provided. The switching element for selecting a specific unit cell in a semiconductor device including a plurality of unit cells may include a transistor, a diode and the like. One end of the switching element may be electrically coupled to a contact plug to be described below, and the other end of the switching element may be electrically coupled to a source line through a source line contact (SLC) (not shown).

An interlayer dielectric layer 12 is formed over the substrate 11. This interlayer dielectric layer 12 may include a monolayer or single layer made of a material of oxide, nitride, or oxynitride, or the interlayer dielectric layer 12 may have a multilayer structure comprising two or more layers of the above listed materials.

A contact plug 13 may be formed through the following process: (1) forming a contact hole (not illustrated) through the interlayer dielectric layer 12 so as to expose the substrate 11, and (2) forming a conductive material on the entire surface of the resultant structure so as to fill the contact hole with the conductive material.

Figure 3B:
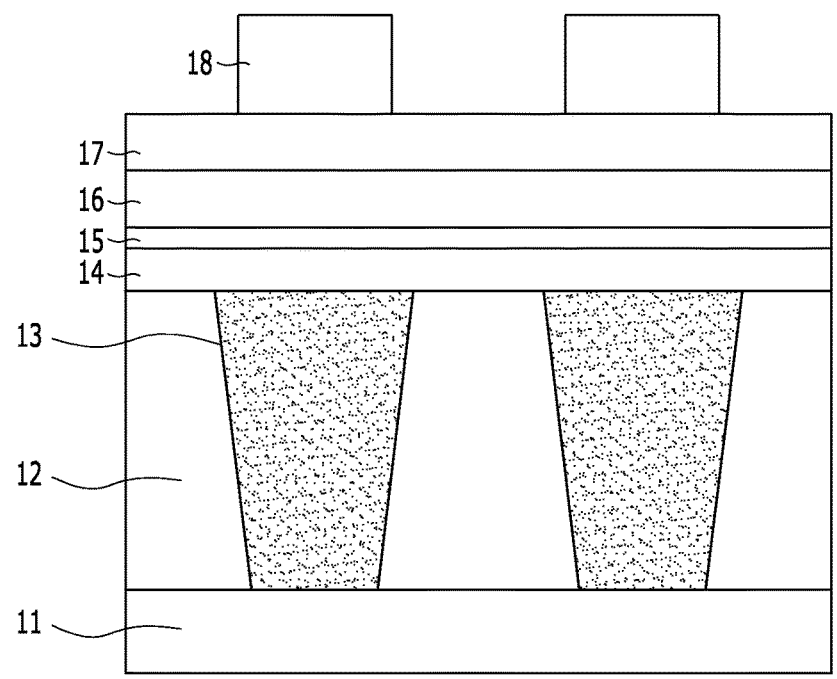

Referring to FIG. 3B, a first conductive layer 21A as an electrode, a first magnetic layer 14, a tunnel barrier layer 15, a second magnetic layer 16, and a second conductive layer 17 are sequentially deposited over the interlayer dielectric layer 12 that includes the contact plug 13.

In some embodiments, one of the first and second magnetic layers 14 and 16 may include a pinned ferromagnetic layer of which the magnetization direction is pinned to a fixed direction, and the other magnetic layer may include a free ferromagnetic layer of which the magnetization direction may be varied according to the direction of a current applied to a variable resistance element to be described below. Each of the first and second magnetic layers 14 and 16 may include a single layer or a multilayer structure containing a ferromagnetic material, for example, Fe—Pt alloy, Fe—Pd alloy, Co—Pd alloy, Co—Pt alloy, Co—Fe alloy, Fe—Ni—Pt alloy, Co—Fe—Pt alloy, Co—Ni—Pt alloy, Co—Fe—B alloy, Co—Fe—B—Ta alloy, Co—Fe—B—Si alloy, among others. This ferromagnetic material may further include impurities such as B. However, the present implementation is not limited to the particular ferromagnetic materials described above.

Note that the magnetization direction of the free ferromagnetic layer may be changed through electron tunneling through the tunnel barrier layer 15A. The tunnel barrier layer 15 may include a single layer or a multilayer structure containing a dielectric material, for example, oxide, which can include but are not limited to, $Al_2O_3$, MgO, CaO, SrO, TiO, VO, NbO, $HfO_2$, $Ta_2O_3$.

The tunnel barrier layer 15 may be formed through RF sputtering or pulsed DC sputtering. Furthermore, the tunnel barrier layer 15 may be formed by depositing a material of Mg, Al, Ti, Ta or Hf and then oxidizing the deposited material.

Each of the first and second electrodes 21 and 17 may include a metallic layer. The metallic layer is a conductive layer containing a metal element, which may include metal, metal oxide, metal nitride, metal oxynitride, metal silicide and the like. For example, the metallic layer may include a metallic layer made of Ta, Ru, PtMn, Cr, W, Ti, TiN, TaN, AlTiN, or HfB or the metallic layer may include a stacked structure of two or more materials.

Further referring to FIG. 3B, a hard mask pattern 18 is formed over the second conductive layer 17. The hard mask pattern 18 may be formed to define a variable resistance element region. The hard mask pattern 18 may be formed by the following process: (1) forming a hard mask layer over the second conductive layer 17 and (2) patterning the illustrated hard mask pattern. The hard mask pattern 18 may include a material having a sufficient highetching selectivity with respect to the second conductive layer 17, the second magnetic layer 16, the tunnel barrier layer 15, the first magnetic layer 14, the first conductive layer (not illustrated), and the second interlayer dielectric layer 12. For example, the hard mask pattern 18 may include an insulating material, and the insulating material may include nitride.

Figure 3C:
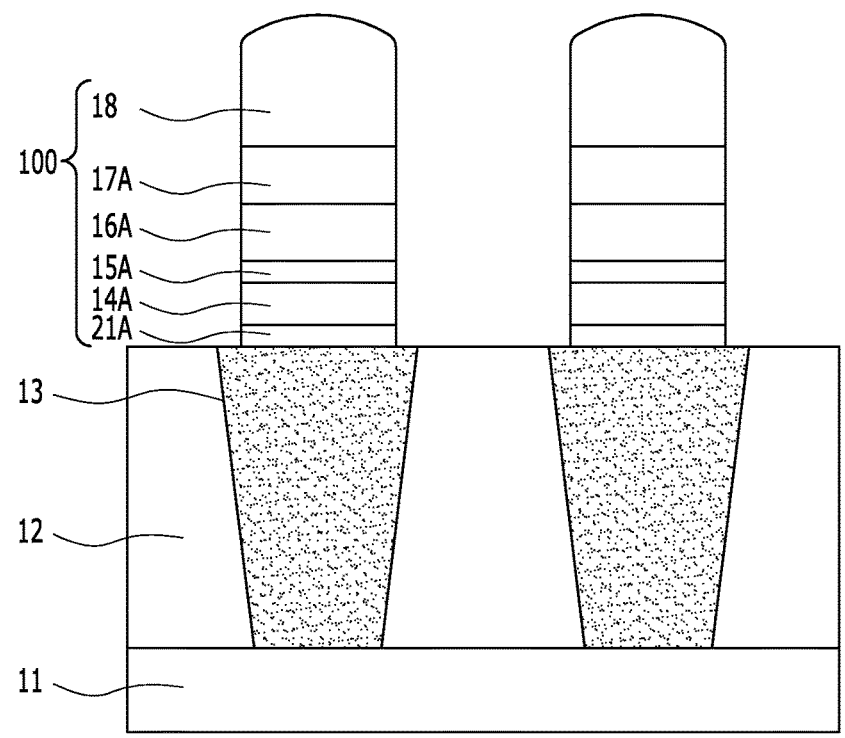

Referring to FIG. 3C, the hard mask pattern 18 is used as an etch barrier to sequentially etch the second conductive layer 17, the second magnetic layer 16, the tunnel barrier layer 15, the first magnetic layer 14, and the first conductive layer 21 shown in FIG. 3B.

As a result, a variable resistance element 100 is formed, which has a stacked structure of the first conductive layer, the first magnetic layer 14A, the tunnel barrier layer 15A, the second magnetic layer 16a, the second conductive layer 17A, and the hard mask pattern 18.

Figure 3D:
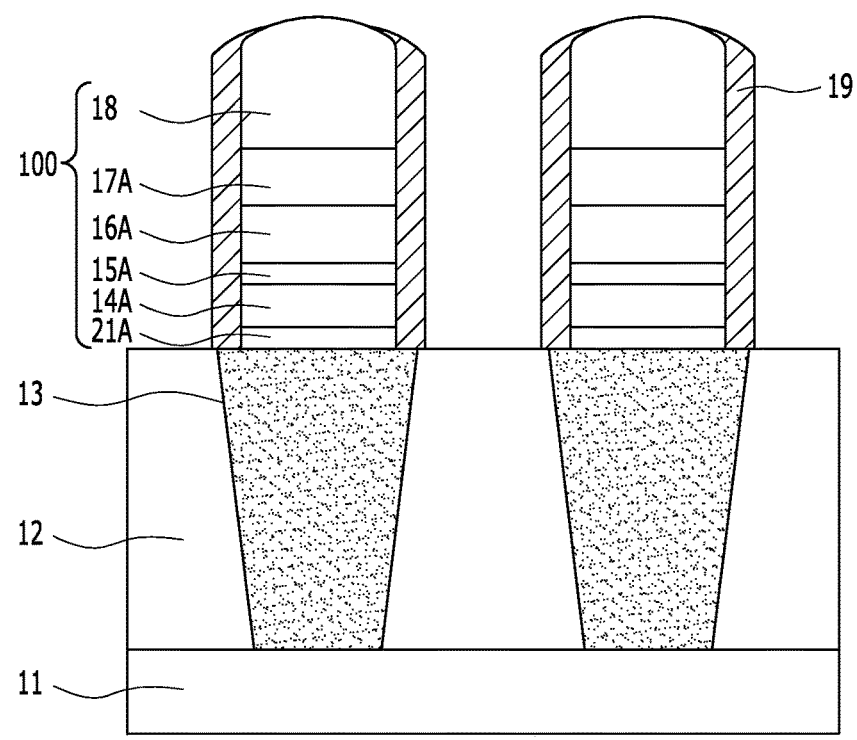

Referring to FIG. 3D, an anti-oxidation layer 19 is subsequently formed on the sidewall of the variable resistance element 100. The anti-oxidation layer 19 is formed in a spacer-like structure on the sidewall of the variable resistance element 100, and may have a shape to surround the variable resistance element 100. The anti-oxidation layer 19, which may include an insulating material, serves to prevent oxidation of the variable resistance element 100.

In the present implementation, the variable resistance element 100 does not include a magnetic compensation layer within the stacked structure. As a result, the total thickness of the stacked structure may be reduced by the thickness of the magnetic compensation layer that would normally be included in the variable resistance element 100 in a conventional design, which may also reduce an etching burden during a patterning process. Thus, the damage to the sidewall from etching and the problem of re-deposition of etch products may be reduced during the patterning process, which leads to improvement in the magnetic properties of the semiconductor device.

Notably, the variable resistance element 100 may have a different resistance value according to the magnetization directions of the two magnetic layers 14 and 16. For example, when the magnetization directions of the two magnetic layers 14 and 16 are identical to each other (or substantially parallel to each other), the variable resistance element 100 may have a low resistance state, and when the magnetization directions of the two magnetic layers 14 and 16 are different from each other (e.g., anti-parallel to each other), the variable resistance element 100 may have a high resistance state.

Figure 3E:
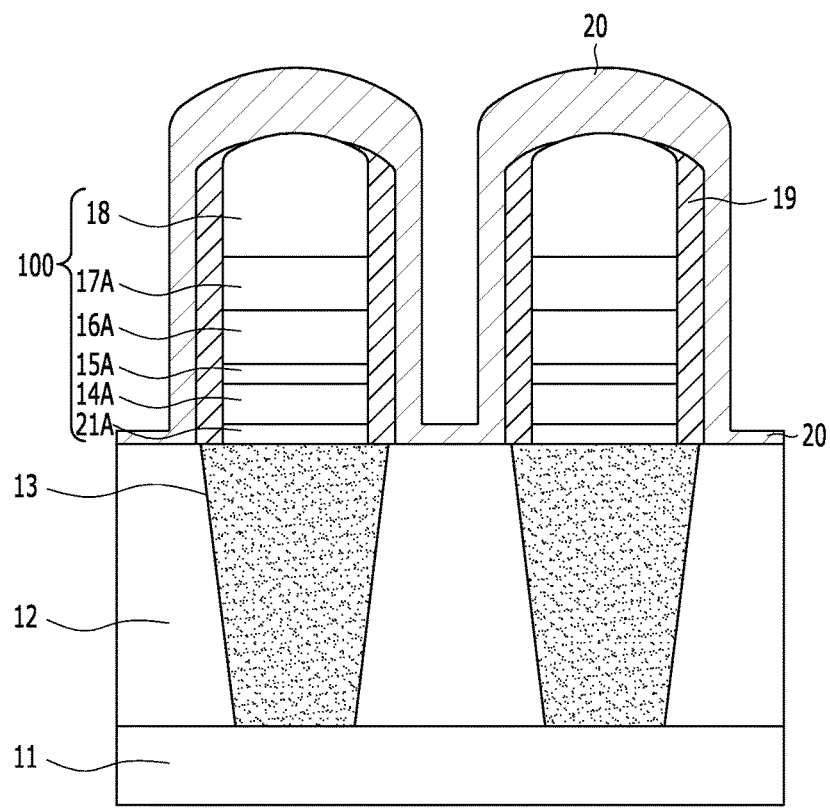

Referring to FIG. 3E, a metallic magnetic layer 20 subsequently is formed over and around the entire structure including the variable resistance element 100 and the anti-oxidation layer 19. The metallic magnetic layer 20 may have an opposite magnetization direction to the pinned magnetic layer within variable resistance element 100, and may include a ferromagnetic material or anti-ferromagnetic material. For example, the metallic magnetic layer 20 may include a material having a horizontal magnetization. The metallic magnetic layer 20 may include a ferromagnetic material such as Co, Fe, Ni, or Nb or a mixture thereof.

Figure 3F:
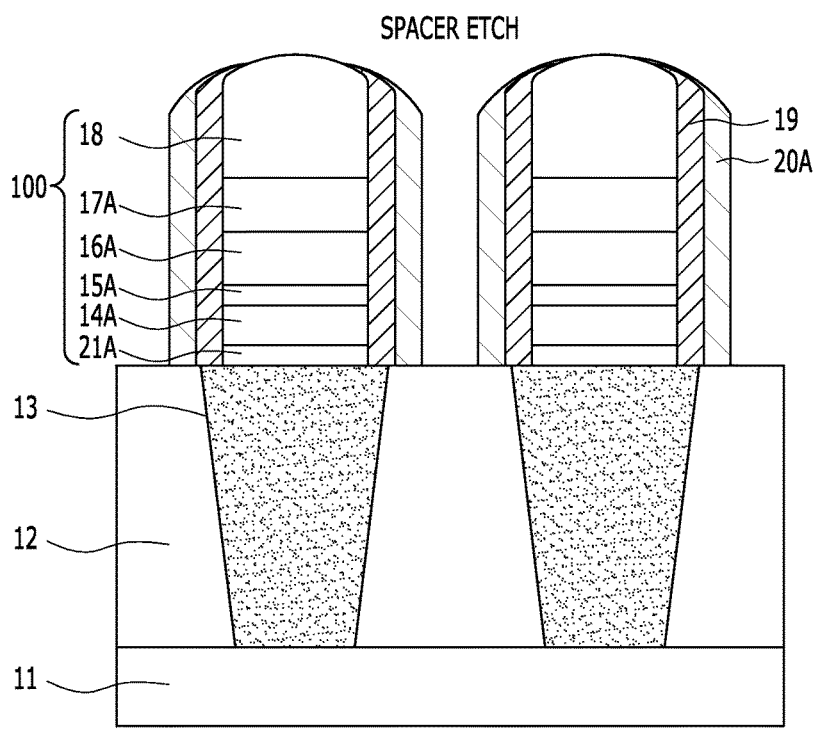

Referring to FIG. 3F, the metallic magnetic layer 20 is then etched from the top so that the metallic magnetic layer 20 is substantially removed from the top but at least partially left on the sidewall of the variable resistance element 100. The remaining metallic magnetic layer 20 is referred to as "a magnetic compensation layer 20A," which is formed over the anti-oxidation layer 19. The magnetic compensation layer 20A may be obtained through a spacer etch process, and the spacer etch process may be performed on the metallic magnetic layer 20 until the interlayer dielectric layer 12 is exposed. As a result, the magnetic compensation layer 20A is formed to surround the sidewall of the variable resistance element 100, and has a ring shape when viewed from the top (as seen in FIG. 4).

Figure 3G:
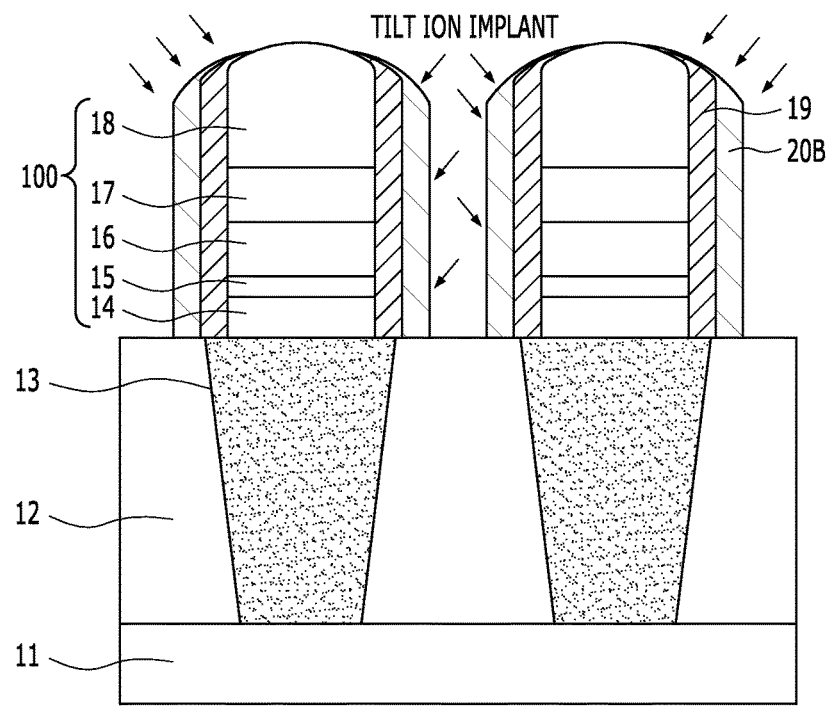
Figure 5:
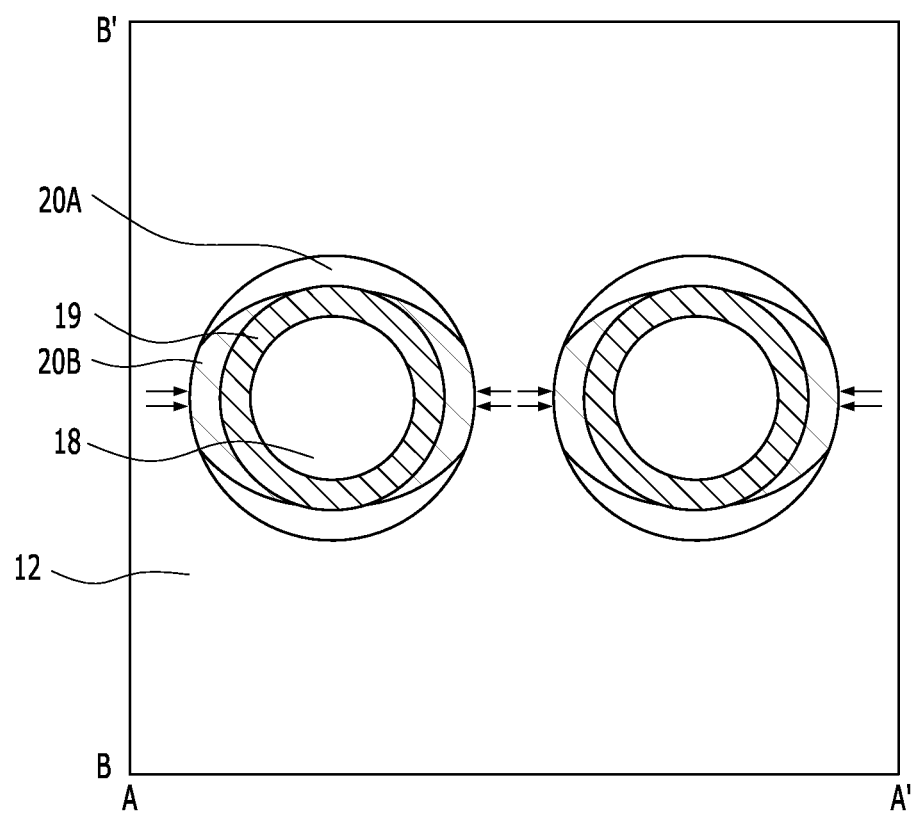
FIG. 5 shows a top view of the semiconductor device illustrated in FIG. 3F.

Referring to FIG. 3G, a tilt ion implant process is next performed on the magnetic compensation layer 20A in two directions D1 and D2 to form a non-magnetic layer 20B from the magnetic compensation layer 20A. The regions in the magnetic compensation layer 20A where ion implant are not performed remain to be the magnetic compensation layer 20A having the original horizontal magnetization, and the regions where ion implant are performed lose the original magnetism and become the non-magnetic layer 20B. Thus, the magnetic compensation layer 20A which is formed in this manner has a pillar shape outside of the anti-oxidation layer 19 and over two opposing sides of the sidewall of the variable resistance element 100 (as seen in FIG. 5). At this point, a protection layer 20A and 20B of the variable resistance element 100 described in FIGS. 2A-2C is formed, which includes the magnetic compensation layer 20A and the non-magnetic layer 20B. In some embodiments, the tilt ion implant process may be performed using impurities such as arsenic (As) or phosphorus (Ph).

Figure 4:
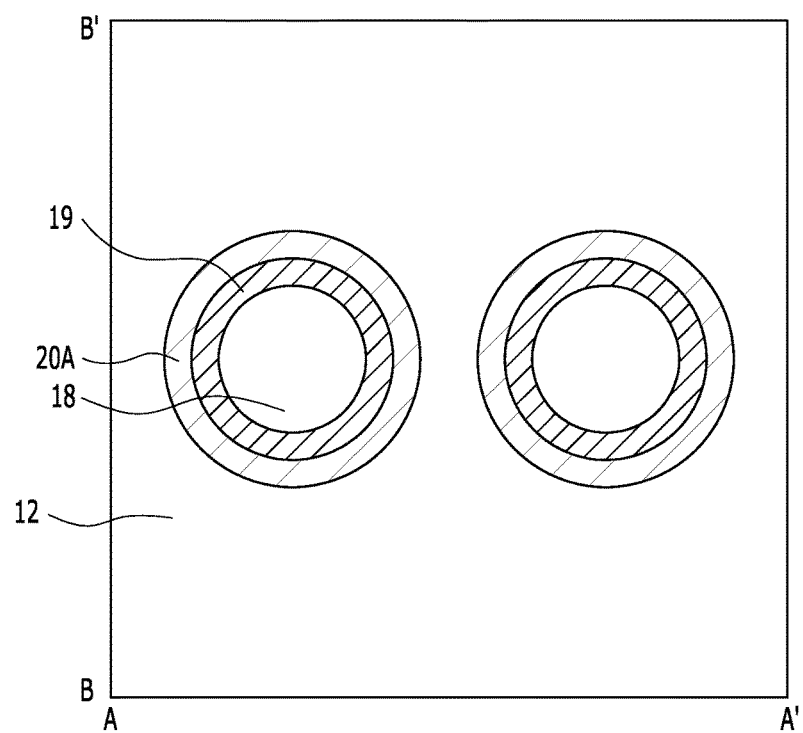
FIG. 4 shows a top view of the semiconductor device illustrated in FIG. 3F.

Hence, through the tilt ion implant process, the magnetic compensation layer 20A is formed in a pillar shape as illustrated in FIG. 5, instead of a ring type to surround the variable resistance element 100 as illustrated in FIG. 4. Because the pillar-shaped magnetic compensation layer 20A has a relatively small width comparing to its height (in the vertical direction), the horizontal magnetization may be stronger than vertical magnetization. In the present implementation, because the tilt ion implant is used to form the pillar-shaped magnetic compensation layer 20A on two opposing sides of the sidewall of the variable resistance element 100, the magnetic compensation layer 20A shown in FIG. 5 may have a smaller width (in the A-A' direction) than the ring-type magnetic compensation layer 20A shown in FIG. 5. Consequently, vertical magnetic fields may uniformly enter the respective magnetic layers within the variable resistance element 100, thereby maximizing the horizontal magnetic characteristic of the magnetic compensation layer 20B, that is, the shape magnetic anisotropy.

In the present implementation, the magnetic compensation layer 20A resistance element 100, is formed in a spacer-like structure on the sidewall of the variable resistance element 100 to surround a part of the variable resistance element 100, instead of being formed as an upper layer within the variable resistance element 100, the total thickness of the variable resistance element 100 is reduced. In other words, because the magnetic compensation layer 20A is separately formed and separate from the variable resistance element 100, the total thickness of the variable resistance element 100 may be reduced by the thickness of the magnetic compensation layer 20A that would normally be included in the variable resistance element 100 in a conventional design. Thus, during a subsequent patterning process, an etching burden may be reduced, and the difficulty level of the process can be lowered. Furthermore, because the damage to the sidewall from etching and the problem of re-deposition of etch by-product may be reduced or prevented during the patterning process, the magnetization characteristic of the semiconductor device may be improved.

Furthermore, as the magnetic compensation layer 20A is formed in a pillar shape using a material having horizontal magnetization instead of a material having vertical magnetization, vertical magnetic fields may uniformly enter the respective magnetic layers, thereby lowering the difficulty level of the process.

In addition, because the magnetic compensation layer 20A is formed in a spacer shape on the sidewall of the variable resistance element 100, the same effect from the magnetic compensation layer 20A can be applied to the magnetic layers 14A and 16A regardless of the thickness or height of these magnetic layers. Furthermore, as the vertical magnetic fields uniformly enter the respective magnetic layers, a strong stray field may be formed to maximize the compensation effect against magnetic field deflection in the free ferromagnetic layer.

In some embodiments, in order to form the pillar-shaped magnetic compensation layer 20A on two opposing sides of sidewall of the variable resistance element 100, the tilt ion implant process is performed two or more times. Hence, the magnetic compensation layer 20A may be formed on two opposing sides of the sidewall of the variable resistance element 100 which are symmetrical with respect to the variable resistance element 100.

In conclusion, various embodiments of the described technology form the magnetic compensation layer on the sidewall of the variable resistance element so as to surround a part of the variable resistance element. As a result, the total thickness of the variable resistance element may be reduced to improve an etch margin during the patterning process.

Furthermore, as the vertical magnetic fields uniformly enter the respective magnetic layers, a strong stray field can be formed in the entire variable resistance element, thereby maximizing the compensation effect against the magnetic field deflection in the free ferromagnetic layer.

The above and other memory circuits or semiconductor devices based on the disclosed technology can be used in a range of devices or systems. FIGS. 6-10 provide some examples of devices or systems that can implement the memory circuits disclosed herein.

Figure 6:
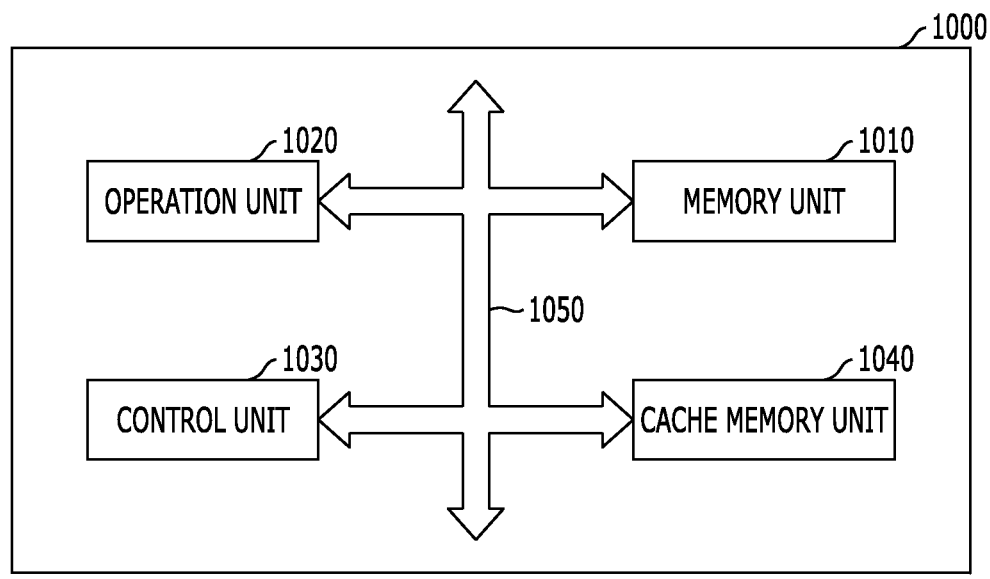
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a variable resistance element having a stacked structure of a first magnetic layer, a tunnel barrier layer, and a second magnetic layer; and a protection layer comprising a pillar-shaped magnetic compensation layer and a nonmagnetic layer, which are formed on both sidewalls of the variable resistance element. Through this, a fabrication process of the memory unit 1010 may become easy and the reliability of the memory unit 1010 may be improved. As a consequence, a fabrication process of the microprocessor 1000 may become easy and the reliability of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
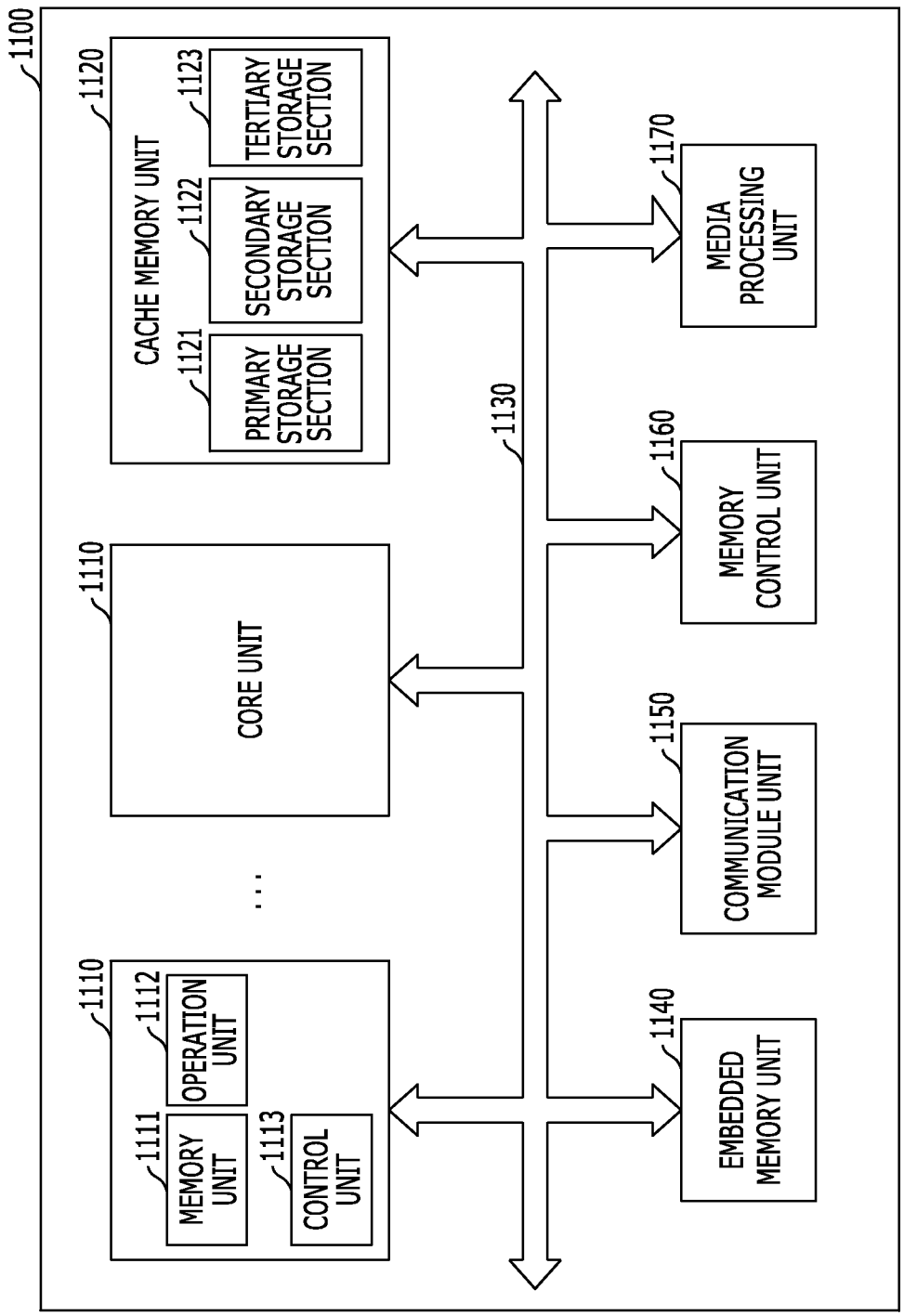
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a variable resistance element having a stacked structure of a first magnetic layer, a tunnel barrier layer, and a second magnetic layer; and a protection layer comprising a pillar-shaped magnetic compensation layer and a non-magnetic layer, which are formed on both sidewalls of the variable resistance element. Through this, a fabrication process of the cache memory unit 1120 may become easy and the reliability of the cache memory unit 1120 may be improved. As a consequence, a fabrication process of the processor 1100 may become easy and the reliability of the processor 1100 may be improved.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
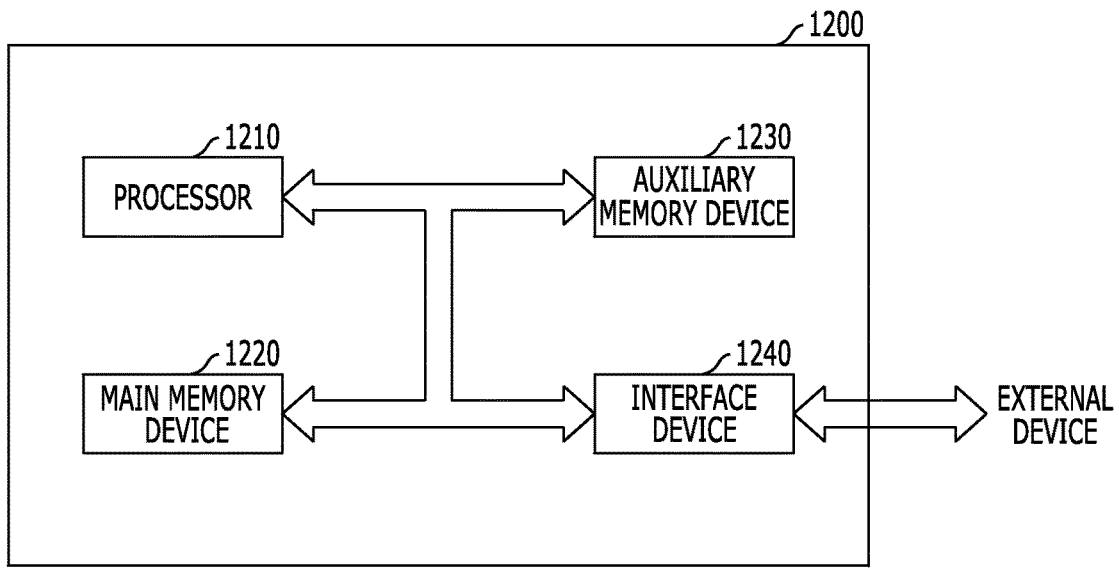
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a variable resistance element having a stacked structure of a first magnetic layer, a tunnel barrier layer, and a second magnetic layer; and a protection layer comprising a pillar-shaped magnetic compensation layer and a non-magnetic layer, which are formed on both sidewalls of the variable resistance element. Through this, a fabrication process of the main memory device 1220 may become easy and the reliability of the main memory device 1220 may be improved. As a consequence, a fabrication process of the system 1200 may become easy and the reliability of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a variable resistance element having a stacked structure of a first magnetic layer, a tunnel barrier layer, and a second magnetic layer; and a protection layer comprising a pillar-shaped magnetic compensation layer and a non-magnetic layer, which are formed on both sidewalls of the variable resistance element. Through this, a fabrication process of the auxiliary memory device 1230 may become easy and the reliability of the auxiliary memory device 1230 may be improved. As a consequence, a fabrication process of the system 1200 may become easy and the reliability of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
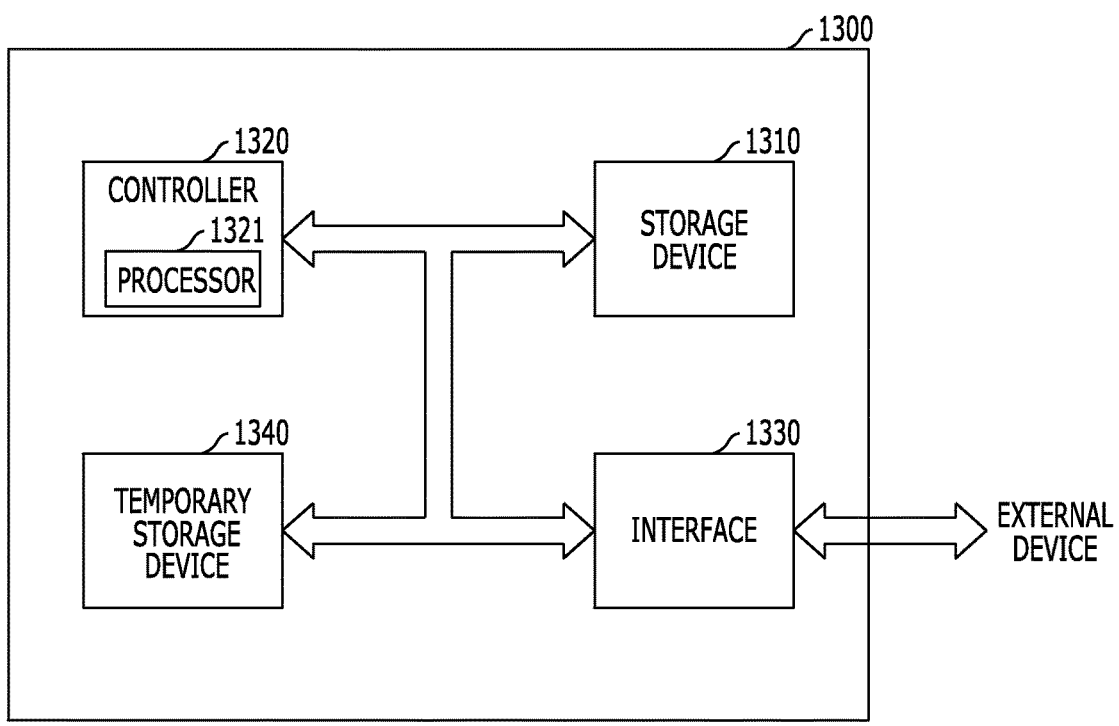
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a variable resistance element having a stacked structure of a first magnetic layer, a tunnel barrier layer, and a second magnetic layer; and a protection layer comprising a pillar-shaped magnetic compensation layer and a non-magnetic layer, which are formed on both sidewalls of the variable resistance element. Through this, a fabrication process of the storage device 1310 or the temporary storage device 1340 may become easy and the reliability of the storage device 1310 or the temporary storage device 1340 may be improved. As a consequence, a fabrication process of the data storage system 1300 may become easy and the reliability of the data storage system 1300 may be improved.

Figure 10:
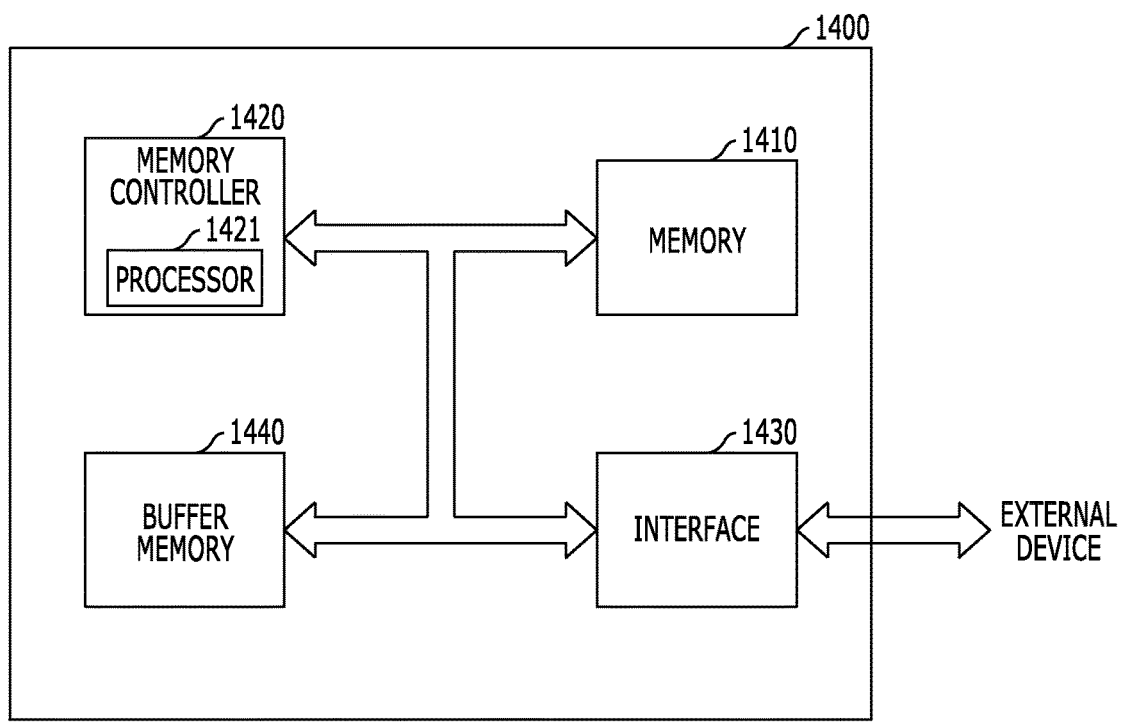
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a variable resistance element having a stacked structure of a first magnetic layer, a tunnel barrier layer, and a second magnetic layer; and a protection layer comprising a pillar-shaped magnetic compensation layer and a non-magnetic layer, which are formed on both sidewalls of the variable resistance element. Through this, a fabrication process of the memory 1410 may become easy and the reliability of the memory 1410 may be improved. As a consequence, a fabrication process of the memory system 1400 may become easy and the reliability of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a variable resistance element having a stacked structure of a first magnetic layer, a tunnel barrier layer, and a second magnetic layer; and a protection layer comprising a pillar-shaped magnetic compensation layer and a non-magnetic layer, which are formed on both sidewalls of the variable resistance element. Through this, a fabrication process of the buffer memory 1440 may become easy and the reliability of the buffer memory 1440 may be improved. As a consequence, a fabrication process of the memory system 1400 may become easy and the reliability of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a variable resistance element is easy, and it is possible to secure the characteristics of the variable resistance element.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory which includes:
    a variable resistance element having a stacked structure that includes a first magnetic layer that exhibits a fixed magnetization, a tunnel barrier layer, and a second magnetic layer that exhibits a variable magnetization which changes relative to the fixed magnetization in the first magnetic layer, wherein the tunnel barrier layer is between the first magnetic layer and the second magnetic layer; and
    a protection layer formed on a sidewall of the variable resistance element, wherein the protection layer includes both a magnetic compensation layer and a non-magnetic layer,
    wherein the magnetic compensation layer and the non-magnetic layer are conductive metallic layers and are formed on different portions of the sidewall of the variable resistance element, and the magnetic compensation layer includes two magnetic compensation layer sections separated from each other and located on two opposite sidewall surfaces of the variable resistance element, and;
    wherein each of the two magnetic compensation layer sections exhibits a fixed magnetization that magnetically reduces, at the second magnetic layer of the variable resistance element, an influence of a magnetic stray field at the second magnetic layer produced by the fixed magnetization of the first magnetic layer.

2. The electronic device of claim 1, wherein the magnetic compensation layer comprises a magnetic material having a horizontal magnetization substantially parallel to a layer in the variable resistance element.

3. The electronic device of claim 1, wherein the magnetic compensation layer comprises one or more of Co, Fe, Ni, Nd, and a mixture thereof.

4. The electronic device of claim 1, wherein the first magnetic layer comprises a pinned ferromagnetic layer and the second magnetic layer comprises a free ferromagnetic layer.

5. The electronic device of claim 1, wherein each of the first magnetic layer and the second magnetic layer comprises a magnetic layer or a multilayer structure of two or more magnetic layers, wherein the first or second magnetic layer includes CoFe, CoFeB, CoFeBTa, or CoFeBSi.

6. The electronic device of claim 1, wherein the tunnel barrier layer comprises MgO, $Al_2O_3$, $TiO_2$, $HfO_2$, or $Ta_2O_3$.

7. The electronic device of claim 1, wherein the variable resistance element further includes an anti-oxidation layer formed between the variable resistance element and the protection layer.

8. The electronic device of claim 1, wherein the variable resistance element comprises a bottom electrode disposed at the bottom of the variable resistance element.

9. The electronic device of claim 8, wherein the variable resistance element further comprises a top electrode disposed at the top of the variable resistance element.

10. The electronic device of claim 9, wherein the bottom electrode or the top electrode comprises any one metal layer or a combination of two or more metal layers selected from Ta, Ru, PtMn, Cr, W, Ti, TiN, TaN, AlTiN, HfN, or HfB.

11. The electronic device of claim 1, further comprising a processing system which includes:
   a processor configured to decode a command received by the processor and control an operation for information based on a result of decoding the command;
   an auxiliary memory device configured to store a program for decoding the command and the information;
   a main memory device configured to call and store the program and the information from the auxiliary memory device such that the processor can perform the operation using the program and the information when executing the program; and
   an interface device configured to perform communication between at least one of the processor, the auxiliary memory device and the main memory device and the outside,
   wherein the semiconductor memory that includes the variable resistance element is part of the auxiliary memory device or the main memory device in the processing system.

12. The electronic device of claim 4, wherein the magnetic compensation layer is configured with a magnetization direction opposite to the magnetization direction of the pinned ferromagnetic layer to compensate for an effect of the pinned ferromagnetic layer on the free ferromagnetic layer.

13. The electronic device of claim 1, wherein the protection layer on the sidewall serves as an etch barrier for the first magnetic layer and the second magnetic layer during an etch process to prevent the first and second magnetic layers from losing magnetization.

14. The electronic device of claim 1, the protection layer is absent from the top surface of the variable resistance stack.

15. The electronic device of claim 1, the protection layer is absent in a gap between two adjacent variable resistance elements.

16. The electronic device of claim 2, wherein the magnetic compensation layer has a pillar shape which enhances the horizontal magnetization through a shape magnetic anisotropy effect.

17. An electronic device comprising a semiconductor memory which includes:
   a substrate;
   variable resistance elements formed over the substrate, each variable resistance element having a stacked structure that includes a pinned magnetic layer that exhibits a fixed magnetization, a tunnel barrier layer, and a free magnetic layer that exhibits a variable magnetization which changes relative to the fixed magnetization in the pinned magnetic layer, wherein the tunnel barrier layer is between the pinned magnetic layer and the free magnetic layer and each variable resistance element exhibits different resistance states based on different relative magnetization directions of the free magnetic layer with respect to the fixed magnetization of the pinned magnetic layer for storing data; and
   a protection layer formed on a sidewall of the variable resistance element to include a magnetic compensation layer and a non-magnetic layer that are conductive metallic layers and are formed on different portions of the sidewall of the variable resistance element, wherein the magnetic compensation layer includes two magnetic compensation layer sections separated from each other and located on two opposite sidewall surfaces of the variable resistance element, and each of the two magnetic compensation layer sections includes a spatially varying geometry and has a spatially varying thickness,
   wherein the two magnetic compensation layer sections produce respective magnetizations at the free magnetic layer of the variable resistance element that magnetically reduce an influence of a magnetic stray field at the free magnetic layer produced by the fixed magnetization of the pinned magnetic layer.

18. The electronic device of claim 17, wherein, in the protection layer, the non-magnetic layer is formed in contact with the sidewall of the variable resistance element, and the magnetic compensation layer is formed outside the non-magnetic layer.

19. The electronic device of claim 17, wherein the magnetic compensation layer includes Co, Fe, Ni, Nd, or a mixture thereof.

20. The electronic device of claim 17, wherein each magnetic layer includes CoFe, CoFeB, CoFeBTa, or CoFeBSi.

21. The electronic device of claim 17, wherein each magnetic layer includes two or more layers forming a composite layer.

22. The electronic device of claim 17, wherein each magnetic layer includes CoFe, CoFeB, CoFeBTa, or CoFeBSi, and wherein the tunnel barrier layer includes MgO, $Al_2O_3$, $TiO_2$, $HfO_2$, or $Ta_2O_3$.

23. The electronic device of claim 17, further comprising an anti-oxidation layer formed between the variable resistance element and the protection layer.

24. The electronic device of claim 1, wherein the non-magnetic layer includes a spatially varying geometry and has a spatially varying thickness.

25. The electronic device of claim 1, wherein the non-magnetic layer includes different non-magnetic layer sections separated from one another and interposed between the magnetic compensation layer sections.

26. The electronic device of claim 1, further comprising an insulating layer surrounding sidewalls of the variable resistance element, wherein the protection layer is formed outside the insulating layer.

* * * * *